(12) United States Patent
Lim et al.

(10) Patent No.: US 9,107,313 B2
(45) Date of Patent: Aug. 11, 2015

(54) METHOD OF MANUFACTURING A HYBRID HEAT-RADIATING SUBSTRATE (71) Applicant: SAMSUNG ELECTRO-MECHANICS CO., LTD., Gyunggi-do (KR)

(72) Inventors: Chang Hyun Lim, Seoul (KR); Jung Eun Kang, Gyunggi-do (KR); Heung Soo Park, Seoul (KR); Seog Moon Choi, Gyunggi-do (KR); Kwang Soo Kim, Gyunggi-do (KR); Joon Seok Chae, Gyunggi-do (KR); Sung Keun Park, Gyunggi-do (KR)

(73) Assignee: SAMSUNG ELECTRO-MECHANICS CO., LTD., Gyunggi-Do (KR)

( * ) Notice: Subject to any disclaimer, the term of this patent is extended or adjusted under 35 U.S.C. 154(b) by 0 days.

(21) Appl. No.: 14/133,157

(22) Filed: Dec. 18, 2013

(65) Prior Publication Data

US 2014/0096380 A1    Apr. 10, 2014

Related U.S. Application Data (62) Division of application No. 12/900,226, filed on Oct. 7, 2010, now abandoned.

(30) Foreign Application Priority Data

Jun. 15, 2010    (KR) .................. 10-2010-0056616

(51) Int. Cl.
H05K 7/06         (2006.01)
H05K 3/10         (2006.01)
(Continued)

(52) U.S. Cl.
CPC ............... *H05K 3/10* (2013.01); *H05K 1/0203* (2013.01); *H05K 3/44* (2013.01); *H05K 3/445* (2013.01);
(Continued)

(58) Field of Classification Search
CPC ............... H05K 2203/0315; H05K 1/0203; H05K 1/053; H05K 3/10; H05K 3/108; H05K 3/44; H05K 3/445; H05K 2201/062; H05K 2201/09745; H05K 2201/10166; Y10T 29/4913
USPC ............... 29/825, 832, 840, 846, 852
See application file for complete search history.

(56) References Cited

U.S. PATENT DOCUMENTS 3,337,426 A     8/1967  Celto
4,939,316 A *   7/1990  Mahulikar et al. ............ 174/546
(Continued)

FOREIGN PATENT DOCUMENTS

JP    51-45763       4/1976
JP    1976-045763    4/1976
(Continued)

OTHER PUBLICATIONS

JP 2010-207686 Office Action dated Nov. 12, 2013; 6pgs.
(Continued)

*Primary Examiner* — Carl Arbes
(74) *Attorney, Agent, or Firm* — Bracewell & Guiliani LLP; Brad Y. Chin (57) ABSTRACT

Disclosed herein are a hybrid heat-radiating substrate including a metal core layer; an oxide insulating core layer that is formed in a thickness direction of the metal core layer to have a shape where the oxide insulating core layer is integrally formed with the metal core layer, an oxide insulating layer that is formed on one surface or both surfaces of the metal core layer, and a circuit layer that is configured to include first circuit patterns formed on the oxide insulating core layer and second circuit patterns formed on the oxide insulating layer, and a method of manufacturing the same.

5 Claims, 6 Drawing Sheets

(51) Int. Cl.
*H05K 1/02* (2006.01)
*H05K 3/44* (2006.01)
*H05K 1/05* (2006.01)

(52) U.S. Cl.
CPC ............... *H05K 1/053* (2013.01); *H05K 3/108* (2013.01); *H05K 2201/062* (2013.01); *H05K 2201/09745* (2013.01); *H05K 2201/10166* (2013.01); *H05K 2203/0315* (2013.01); *Y10T 29/4913* (2015.01)

(56) References Cited

U.S. PATENT DOCUMENTS

| | | | |
|---|---|---|---|
| 5,098,864 A * | 3/1992 | Mahulikar | ...................... 29/837 |
| 5,296,735 A | 3/1994 | Fukunaga | |
| 5,384,683 A | 1/1995 | Tsunoda | |
| 5,488,256 A | 1/1996 | Tsunoda | |
| 6,262,477 B1 * | 7/2001 | Mahulikar et al. | ............ 257/698 |
| 8,203,848 B2 | 6/2012 | Takakusaki et al. | |
| 2010/0307800 A1 | 12/2010 | Wee et al. | |

FOREIGN PATENT DOCUMENTS

| | | |
|---|---|---|
| JP | 55-5871 | 2/1980 |
| JP | 1991-069185 | 3/1991 |
| JP | 1998-335866 | 12/1998 |
| KR | 10-2010-0049841 A | 5/2010 |

OTHER PUBLICATIONS

Office Action from counterpart Korean Patent Application No. 10-2010-0056616 dated Aug. 17, 2011; 5 pages including English Summary.

Office Action issued from Japan Patent Office for counterpart Korean Patent Application No. 10-2010-0056616, May 15, 2012, 4pages including Translation summary of Office Action.

\* cited by examiner

METHOD OF MANUFACTURING A HYBRID HEAT-RADIATING SUBSTRATE

RELATED APPLICATION

This application is a divisional application of U.S. patent application Ser. No. 12/900,226, filed on Oct. 7, 2010, and claims the benefit of and priority to Korean Patent Application No. KR 10-2010-0056616, filed on Jun. 15, 2010, all of which are incorporated herein by reference in their entirety into this application.

BACKGROUND

1. Field of the Invention

The present invention relates to a hybrid heat-radiating substrate and a method of manufacturing the same.

2. Description of the Related Art

Recently, the use of multi-functional electronic devices has expanded. Considering characteristics of these products, various electronic components should be mounted on a single substrate. Recently, a heat-radiating problem caused by heat generating elements mounted on the substrate has been an issue. In order to solve the heat-radiating from these heat generating elements, various types of heat-radiating substrates using metal materials with good thermal conductivity have been manufactured.

The heat-radiating substrate including an insulating layer formed on a metal core layer and a circuit layer formed on the insulating layer have been commercialized up to now. The heat-radiating substrate has excellent heat-radiating property as compared to a general organic PCB; however, it is difficult to implement high density/integration of the heat-radiating substrate.

In addition, when heat generating elements such as LED and electronic components vulnerable to heat (hereinafter, thermally weakened elements) are simultaneously mounted on a single substrate, the above-mentioned heat-radiating substrate has high thermal conductivity, such that heat generated from the heat generating elements is transferred to the entire heat-radiating substrate (in particular, through a metal core layer) and is also transferred to an area where heat is not transferred, thereby degrading the performance of the thermally weakened elements.

SUMMARY

Accordingly, the present invention has been made in an effort to provide a hybrid heat-radiating substrate including a metal core layer in order to keep heat-radiating performance of heat generating elements, an oxide insulating core layer having lower thermal conductivity than the metal core layer that is integrally formed with the metal core layer by volume anodizing, and thermally weakened elements that is mounted on an oxide insulating core layer, thereby making it possible to protect thermally weakened elements even though heat generating elements and thermally weakened elements are mounted on a single substrate together.

Further, embodiments of the present invention provide a method of manufacturing the hybrid heat-radiating substrate.

In accordance with an embodiment, there is provided a hybrid heat-radiating substrate, which includes a metal core layer; an oxide insulating core layer that is formed in a thickness direction of the metal core layer to have a shape where the oxide insulating core layer is integrally formed with the metal core layer; an oxide insulating layer that is formed on one surface or both surfaces of the metal core layer; and a circuit layer that is configured to include first circuit patterns formed on the oxide insulating core layer and second circuit patterns formed on the oxide insulating layer.

In accordance with another embodiment, one side or two adjacent sides of the oxide insulating core layer are exposed to the outside.

In accordance with another embodiment, the hybrid heat-radiating substrate further includes a protective layer formed on the circuit layer.

In accordance with another embodiment, the first circuit pattern is mounted with thermally weakened elements and the second circuit pattern is mounted with heat generating elements.

In accordance with another embodiment, the metal core layer is made of aluminum and the oxide insulating core layer and the oxide insulating layer are made of alumina.

In accordance with another embodiment, the second circuit patterns are formed on both surfaces of the metal core layer and are connected to each other through a via.

In accordance with another embodiment, the oxide insulating core layer is formed on both surfaces of the metal core layer.

In accordance with at least one embodiment, there is provided a method of manufacturing a hybrid heat-radiating substrate, which includes the steps of providing a metal core member; forming an oxide insulating core layer by performing volume anodizing on the metal core member in a thickness direction; forming an oxide insulating layer by performing surface anodizing on one surface or both surfaces of the metal core member; and forming a circuit layer that is configured to include first circuit patterns positioned on the oxide insulating core layer and second circuit patterns positioned on the oxide insulating layer.

In accordance with another embodiment, the method of manufacturing a hybrid heat-radiating substrate further includes after the forming the circuit layer, forming a protective layer covering the circuit layer.

In accordance with another embodiment, the method of manufacturing a hybrid heat-radiating substrate further includes: after the forming the protective layer, mounting thermally weakened elements on the first circuit patterns formed on the oxide insulating core layer; and mounting heat generating elements on the second circuit patterns formed on the oxide insulating layer.

In accordance with another embodiment, the method of manufacturing a hybrid heat-radiating substrate further includes forming a via connecting the circuit layers formed on both surfaces of the metal core member.

In accordance with another embodiment, the forming the via is performed by forming a through hole penetrating through the metal core member after the forming the oxide insulating core layer, forming an insulating layer in an inner wall of the through hole at the forming the oxide insulating layer, and forming the plating layer in an inner wall of the insulating layer at the forming the circuit layer.

Various objects, advantages and features of the invention will become apparent from the following description of embodiments with reference to the accompanying drawings.

BRIEF DESCRIPTION OF DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

DETAILED DESCRIPTION

The present invention will now be described more fully hereinafter with reference to the accompanying drawings, which illustrate embodiments of the invention. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout. Prime notation, if used, indicates similar elements in alternative embodiments.

Figure 1:
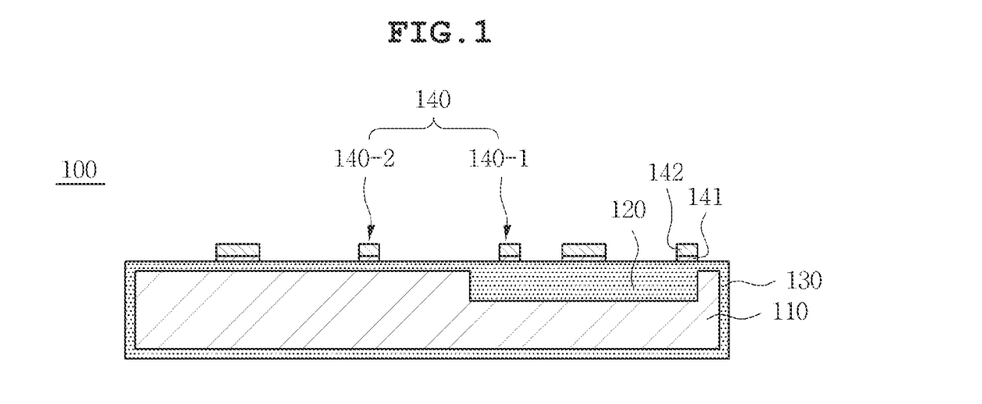
FIG. 1 is a cross-sectional view schematically showing a hybrid heat-radiating substrate, in accordance with an embodiment of the invention.
Figure 2:
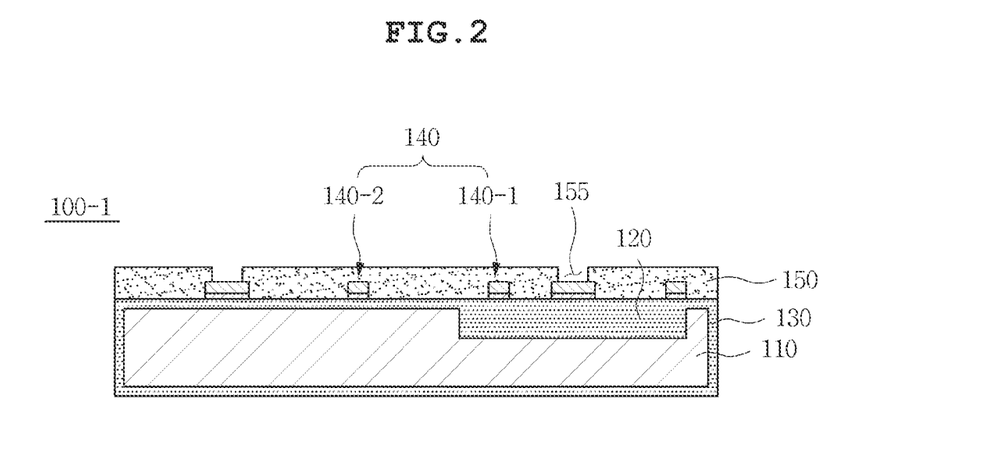
FIGS. 2 to 4 are cross-sectional views schematically showing a modification example of the hybrid heat-radiating substrate shown in FIG. 1, in accordance with an embodiment of the invention.
Figure 3:
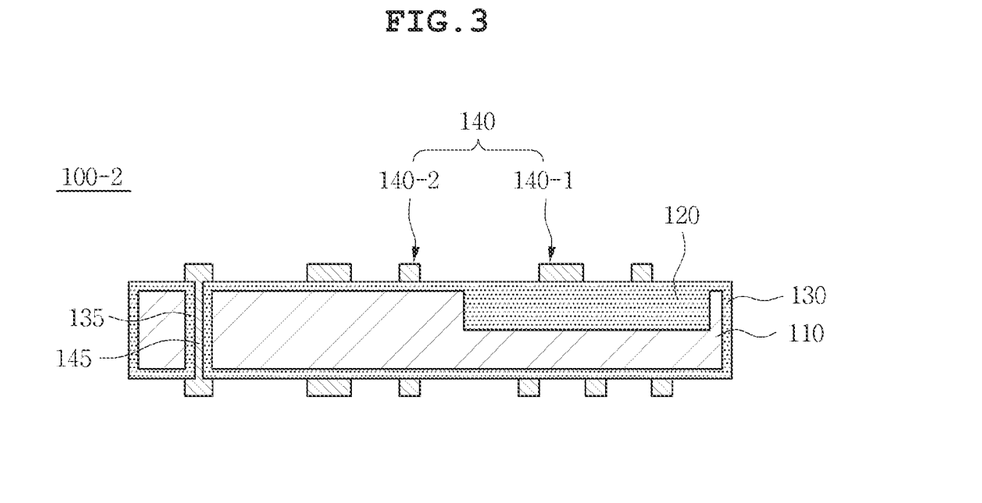
Figure 4:
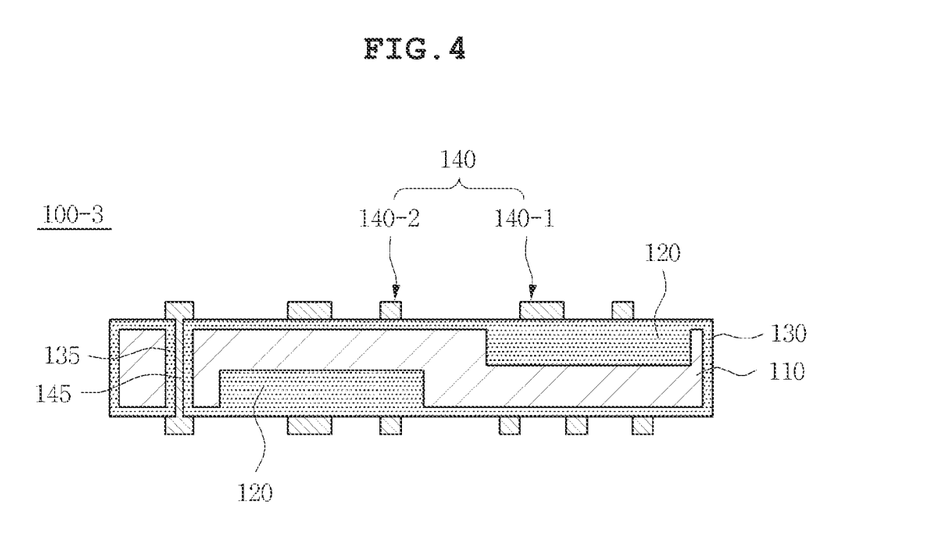

FIG. 1 is a cross-sectional view schematically showing a hybrid heat-radiating substrate (hereinafter, referred to as heat-radiating substrate), in accordance with an embodiment of the invention, and FIGS. 2 to 4 are cross-sectional views schematically showing a modification example of the hybrid heat-radiating substrate shown in FIG. 1, in accordance with an embodiment of the invention. Hereinafter, the hybrid heat-radiating substrate (hereinafter, referred to as heat-radiating substrate) according to the present embodiment will be described with reference to the figures.

As shown in FIG. 1, a heat-radiating substrate 100 includes a metal core layer 110 having larger strength and larger resistance against warpage than a general resin core layer. The metal core layer serves to discharge heat generated from the heat generating elements (not shown) mounted on the heat-radiating substrate 100 to the outside.

The metal core layer 110 generally has a quadrangular shape when being viewed from the top but is not limited thereto. Therefore, the shape thereof may be changed. The metal core layer 110 may be made of aluminum (Al), nickel (Ni), magnesium (Mg), titanium (Ti), zinc (Zn), tantalum (Ta), or an alloy thereof.

An oxide insulating core layer 120 is formed in a thickness direction of a metal core layer 110 to have a shape where it is integrated with the metal core layer 110. The oxide insulating core layer 120, which is a metal oxide layer formed by performing volume anodizing on the metal core layer 110, has insulating property and lower thermal conductivity than that of a metal.

As shown in FIG. 1, the oxide insulating core layer 120 may be formed on one surface of the metal core layer 110 or may be formed on both surfaces thereof. Further, the plurality of oxide insulating core layers 120 may be formed on one surface of the metal core layer 110. Since the oxide insulating core layers 120 are formed by performing volume anodizing on the metal core layer 110, it is not protruded to the outside of the metal core layer 110 but is formed to keep the original shape of the metal core layer. The area of the oxide insulating core layer 120 is determined by an area where it contacts an electrolyte solution during the anodizing treatment and the thickness of the oxide insulating core layer 120 is determined by the anodizing treatment time and the applied voltage.

The oxide insulating core layers 120 are mounted with thermally weakened elements, such that it protects the thermally weakened elements from heat generated from heat generating elements (not shown). As a result, the metal core layer 110 serves to discharge heat and the oxide insulating core layer 120 serves to prevent heat from being transferred, such that a thermally separated area is formed on a single heat-radiating substrate 100.

In this configuration, when the metal core layer 110 is made of aluminum, the oxide insulating core layer 120 is made of alumina ($Al_2O_3$). The aluminum is light, excellent in thermal conductivity, and easy in the anodizing treatment, as compared to the above-mentioned metals (nickel (Ni), magnesium (Mg), titanium (Ti), zinc (Zn), tantalum (Ta)).

In this case, it is preferred that the oxide insulating core layer 120 is formed so that one side or two adjacent sides of the oxide insulating core layer 120 are exposed to the outside. When being viewed from the top, if the edges of the metal core layer 110 are formed with the oxide insulating core layers 120, one side of the oxide insulating core layer 120 is exposed to the outside and if a vertex of the metal core layer 110 is formed with the oxide insulating core layer, two consecutive sides thereof are exposed to the outside.

When the heat-radiating substrate 100 shown in FIG. 1 is considered to be three-dimensional; the oxide insulating core layer 120 has a structure where all four sides thereof are surrounded by the metal core layer 110. Unlike this, when one side or two adjacent sides of the oxide insulating core layer are exposed to the outside, the contact area between the oxide insulating core layer 120 and the metal core layer 110 is reduced and an amount of heat transferred to the oxide insulating core layer 120 is reduced accordingly, which is advantageous in protecting the thermally weakened elements.

The oxide insulating layer 130 is formed on one surface or both surfaces of the metal core layer 110 and serves to separate the circuit layer 140 and the metal core layer 110 that are formed on the heat-radiating substrate. Further, as shown in FIG. 1, the oxide insulating layer 130 may also be formed on the side of the metal core layer 110.

The oxide insulating layer 130 forms the outer surface of the heat-radiating substrate together with the above-mentioned oxide insulating core layer 120; however, it has a thin film shape unlike the oxide insulating core layer 120 such that it has a thin thickness.

The oxide insulating layer 130 is formed by performing a surface anodizing treatment on the metal core layer 110 on which the oxide insulating core layer 120 is formed. Therefore, when the metal core layer 110 is made of aluminum, the oxide insulating layer 130 is also made of alumina ($Al_2O_3$).

The circuit layer 140 includes first circuit patterns 140-1 formed on the oxide insulating core layers 120 and second circuit patterns 140-2 formed on the oxide insulating layer 130. The first circuit patterns 140-1 and the second circuit patterns 140-2 are connected to each other to be able to transfer electrical signals to each other. In addition, as shown in FIG. 1, the circuit layer 140 may have a structure where a seed layer 141 and a plating layer 142 are stacked. It is apparent to those skilled in the art that the structure of the circuit layer may be changed according to a method of manufacturing the same.

The thermally weakened elements (not shown) such as a driver IC are mounted on the first circuit patterns 140-1 formed on the oxide insulating core layers 120 and the heating generation elements (not shown) such as an insulated gate bipolar transistor (IGBT) or a diode are mounted on the second circuit patterns 140-2 formed on the oxide insulating layer 130.

As shown in FIG. 1, the circuit layer 140 has a single layer structure, which is shown by way of example only and therefore, may have a multi-layer structure where the insulating layer and the circuit layer are repeatedly stacked.

Another heat-radiating substrate 100-1 may further include a protective layer 150 that protects the circuit layer 140, as shown in FIG. 2. It is preferable that the protective layer 150 adopts a solder resist. The solder resist serves to prevent solder from being applied on the circuit patterns and protects the circuit layer 140 from being oxidized when performing soldering using a heat-resistant coating material.

In this case, it is preferable that the protective layer 150 is formed with an opening part 155 so that a pad part mounted with electronic components is exposed to the outside.

A pad protective layer (not shown) may be further formed on the pad part. The pad protective layer protects the pad part exposed to the outside from oxidization and improves the solderability and conductivity of components. The pad protective layer includes a metal having low corrosion and high conductivity, such as tin, silver, gold, etc.

In another heat-radiating substrate 100-2 as shown in FIG. 3, the oxide insulating layers 130 are formed on both surfaces of the metal core layer 110 and the second circuit patterns 140-2 are formed on both surfaces of the heat-radiating substrate 100-2.

The second circuit patterns 140-2 formed on both surfaces of the heat-radiating substrate 100-2 perform the same function as the second circuit patterns described with reference to FIGS. 1 and 2 and may have a multi-layer structure and may further include the protective layer.

In this case, in FIG. 3, solder balls, etc., are coupled on the pad parts of the second circuit patterns 140-2 formed on the lower surface of the heat-radiating substrate 100-2 such that the heat-radiating substrate 100-2 may be mounted on another circuit substrate such as a mother board.

In this case, a via 145 electrically connects the second circuit patterns 140-2 formed on the upper surface of the heat-radiating substrate 100-2 to the circuit patterns 140-2 formed on the lower surface thereof and an insulating layer 135 serves to prevent a short between the via 145 and the metal core layer 110.

As shown in FIG. 4, in another heat-radiating substrate 100-3, the oxide insulating core layers 120 may be formed on both surfaces of the metal core layer 110. The first circuit patterns 140-1 are each formed on the oxide insulating core layers 120 formed on both surfaces of the metal core layer 110, such that the thermally weakened elements may be mounted.

When the oxide insulating core layer 120 is formed on both surfaces of the heat-radiating substrate 100-3, a plurality of thermally weakened elements can be selectively mounted, thereby increasing the design degree of freedom of the heat-radiating substrate.

The heat-radiating substrate shown in FIG. 1 and the method of manufacturing the heat-radiating substrate shown in FIG. 2 will be described with reference to FIGS. 5 to 13.

Figure 5:
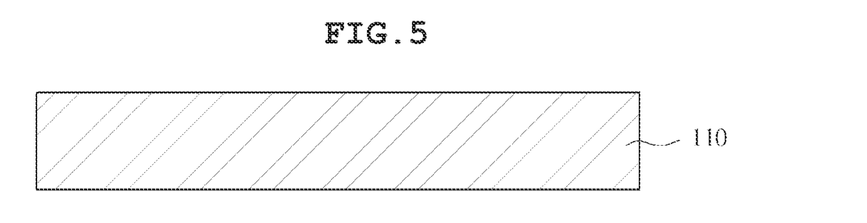
FIGS. 5 to 17 are cross-sectional views schematically showing a manufacturing process of the hybrid heat-radiating substrate shown in FIGS. 1 to 4, in accordance with an embodiment of the invention.

As shown in FIG. 5, the metal core member 110 is first provided. The metal core member 110 forms the metal core layer of the heat-radiating substrate and may be made of, for example, aluminum (Al), nickel (Ni), magnesium (Mg), titanium (Ti), zinc (Zn), tantalum (Ta), or an alloy thereof.

Figure 6:
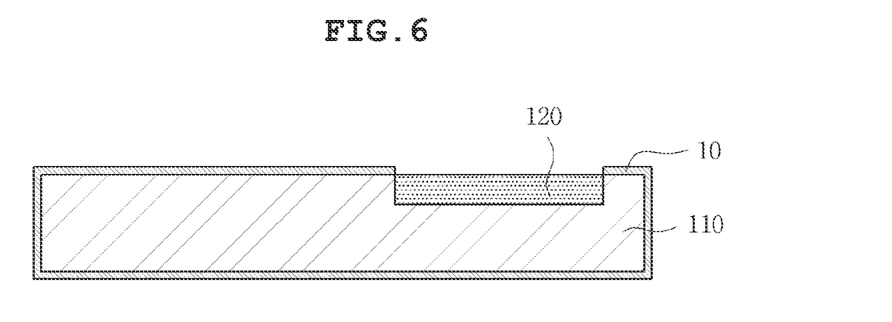

Next, the oxide insulating core layer 120 is formed on one surface of the metal core member 110. As shown in FIG. 6, after a dry film 10 is attached to an area other than an area where the oxide insulating core layer 120 will be formed, volume anodizing is performed to form the oxide insulating core layer 120 in the thickness direction of the metal core member 110.

In the case where the metal core member 110 is, for example, an aluminum member, volume anodizing will be described. First, when the aluminum member reacts with the electrolyte solution, an aluminum metal is oxidized at an interface (surface of aluminum member/electrolyte solution) such that aluminum ions ($Al^{3+}$) are generated. Points, at which current density is concentrated, are formed on the surface of the aluminum member by voltage applied to the aluminum member. Heat is locally generated at these points, the activity of the electrolyte solution (in particular, oxalic acid) is increased, the aluminum metal very rapidly reacts with the electrolyte solution, and aluminum ions are more generated.

In addition, the decomposition reaction of water is generated due to the applied voltage. At this time, the generated oxygen ions ($O^{2-}$) move to the surface of the aluminum member by force of an electric field and react with the aluminum ions generated by the electrolyte solution, thereby forming a porous alumina layer. As the reaction is continued, the porous alumina layer is grown in the thickness direction of the aluminum member and thus, the alumina core layer is formed.

Since the time of volume anodizing is long and the applied voltage is large, volume anodizing forms the alumina layer having a larger thickness than that of surface anodizing.

In addition, since the alumina core layer is formed in the thickness direction of the aluminum member, even though the alumina core layer is formed, the original shape of the aluminum member is kept. In other words, one area of the aluminum member is substituted into the alumina core layer.

Figure 7:
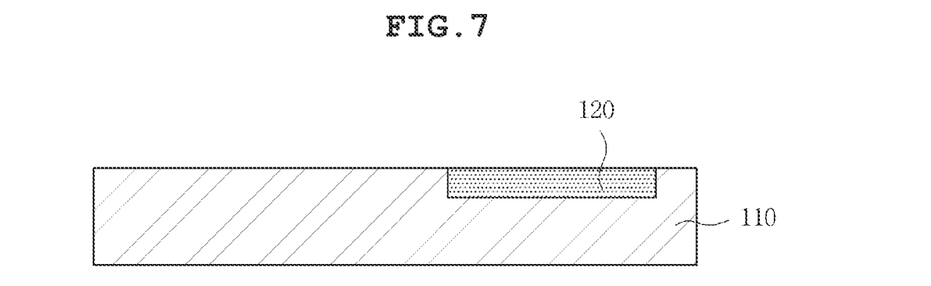
Figure 8:
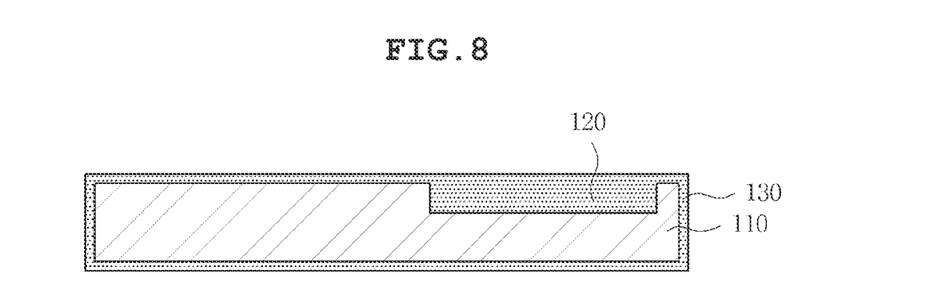
Figure 9:
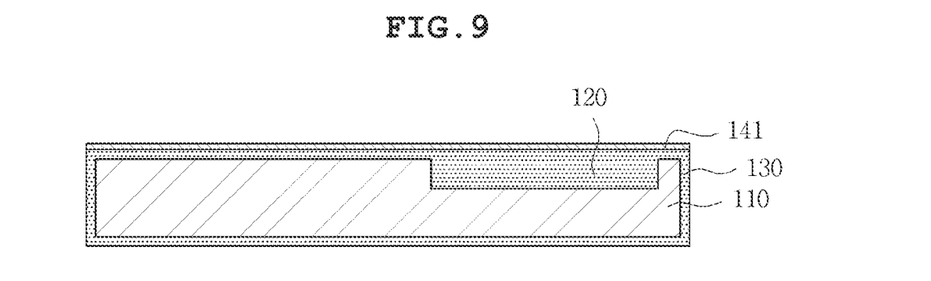
Figure 10:
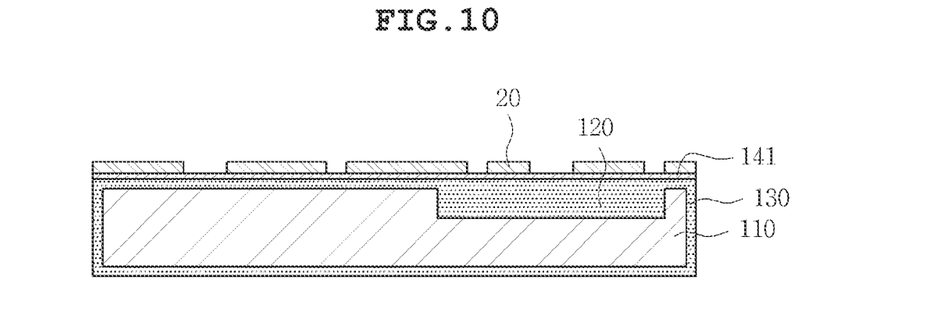
Figure 11:
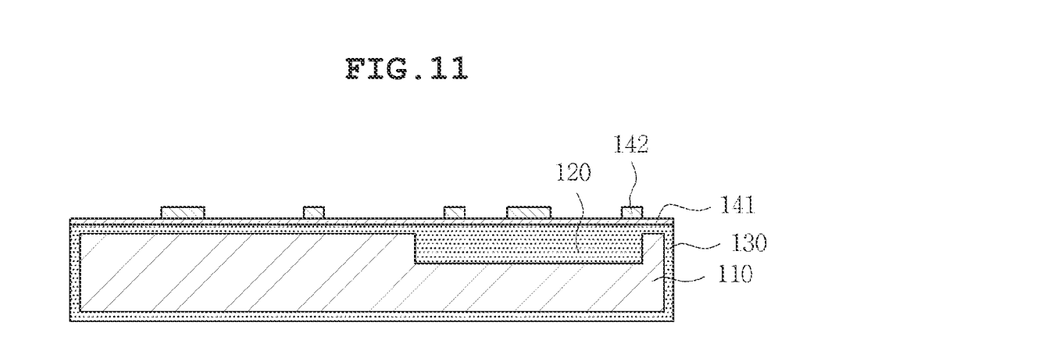
Figure 12:
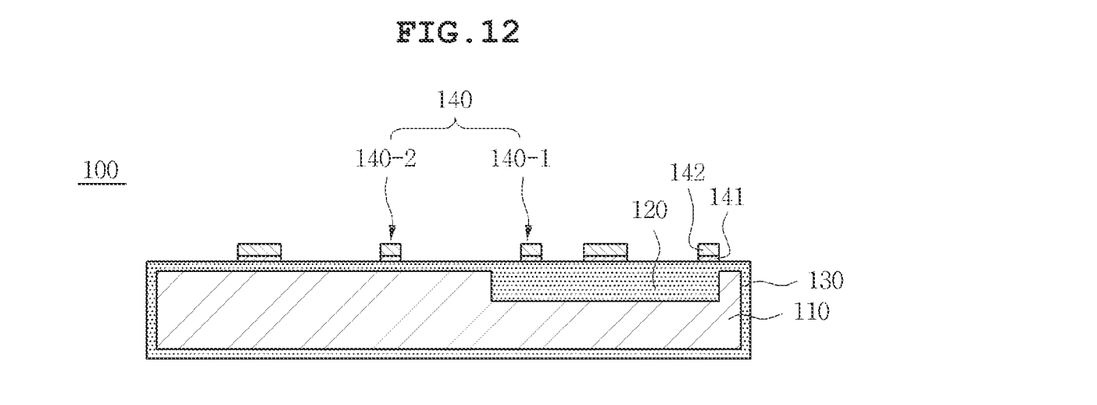

Thereafter, as shown in FIGS. 7 and 8, surface anodizing is performed on the metal core member 110 to form the oxide insulating layer 130.

The oxide insulating layer 130 is also formed in an area where it contacts the electrolyte solution and may be formed on one surface or both surfaces of the metal core member 110 according to the adhesion of the dry film. As shown in FIG. 8, the oxide insulating layer 130 may be formed on a side of the metal core member 110. However, surface anodizing controls the treatment time and the applied voltage of the anodizing to have the thin film shape, unlike volume anodizing.

Meanwhile, the sequence of volume anodizing and surface anodizing may be changed. For example, when surface anodizing is performed over the metal core member 110 and then, the dry film is attached to the oxide insulating layer 130 other than a part thereof and volume anodizing is performed, the metal oxide layer is grown in the area where the dry film is not attached in the thickness direction, thereby forming the oxide insulating core layer 120.

Next, the first circuit patterns 140-1 are formed on the oxide insulating core layer 120 and the second circuit patterns 140-2 are formed on the oxide insulating layer 130, thereby forming the circuit layer 140 of the heat-radiating substrate 100.

The first circuit patterns are electrically connected to the second circuit patterns 140-2. In this case, the first circuit patterns and the second circuit patterns may be simultaneously formed to have the shape where they are connected to each other by one process or they are formed separately and then, may be electrically connected to each other by a wire bonding process.

The circuit layer may be generally formed by a semi-additive process (SAP), a modified semi-additive process (MSAP), a subtractive method, and so on.

A process of forming the circuit layer will be briefly described with reference to FIGS. 9 to 12. First, the seed layer 141 is formed on one surface of the metal core member 110 on which the oxide insulating core layer 120 and the oxide insulating layer 130 are formed. The plating layer 142 is formed by stacking the patterned plating resist film 20 and performing the plating process thereon and then, the plating resist film is removed. Thereafter, when the seed layer 141 in an area where the plating layer 142 is not formed is removed by etching, the first circuit patterns 140-1 are formed on the oxide insulating core layer 120 and the second circuit patterns 140-2 are formed on the oxide insulating layer 130.

Each of the first circuit patterns 140-1 and the second circuit patterns 140-2 includes the pad parts. The first circuit patterns 140-1 are mounted with thermally weakened elements by the solder ball scheme or the wire bonding scheme and the second circuit patterns 140-2 are mounted with the heat generating elements.

Figure 13:
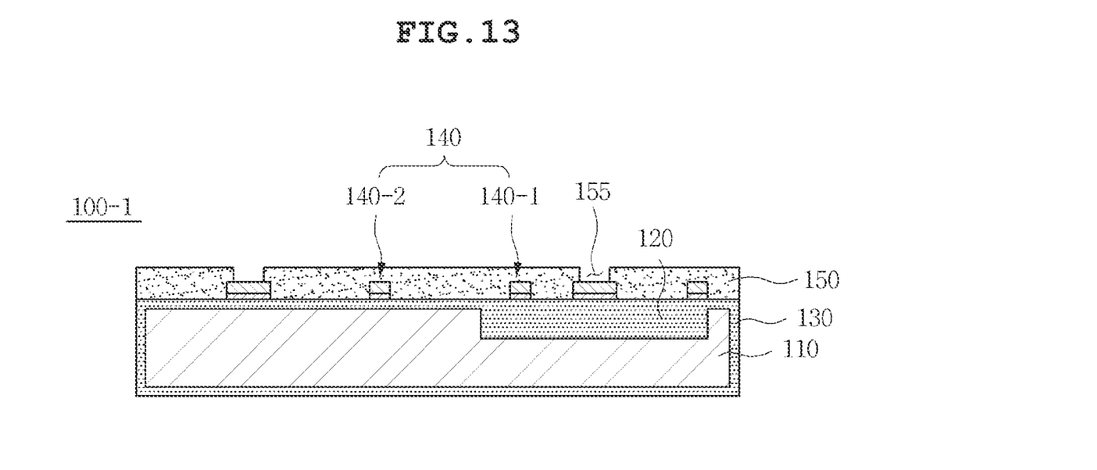

In this case, as shown in FIG. 13, when the protective layer 150 covering the circuit layer 140 is formed prior to mounting the thermally weakened elements and the heat generating elements, the heat-radiating substrate shown in FIG. 2 is manufactured.

The protective layer 150 may be configured of the solder resist and may be formed by any one of a screen printing method, a roller coating method, a curtain coating method, and a spray coating method. It is preferable that the protective layer 150 is provided with an opening part 155 to expose the pad parts included in the circuit layer 140.

The pad protecting layer (not shown) may further be formed on the pad part exposed to the outside by outer surface treatment processes such as an electrolysis plating method, an electroless plating method, electroless nickel/palladium/gold plating method, etc.

Meanwhile, the heat-radiating substrate having a multi-layer structure may be manufactured by performing a build-up process that repeatedly stacks the insulating layer and the circuit layer prior to forming the protective layer 150.

The method of manufacturing the heat-radiating substrate shown in FIGS. 3 and 4 will be described with reference to FIGS. 14 to 17. The circuit layers are formed on both surfaces of the heat-radiating substrate 100-2 shown in FIG. 3. The method of manufacturing the heat-radiating substrate according to the exemplary embodiment further includes forming the via that connects the circuit layers formed on both surfaces of the metal core member.

The via may be formed by forming a through hole on the heat-radiating substrate having the circuit layer formed on both surfaces thereof and then, filling a conductive material in the through hole or by forming the through hole and then, performing the plating process.

Figure 14:
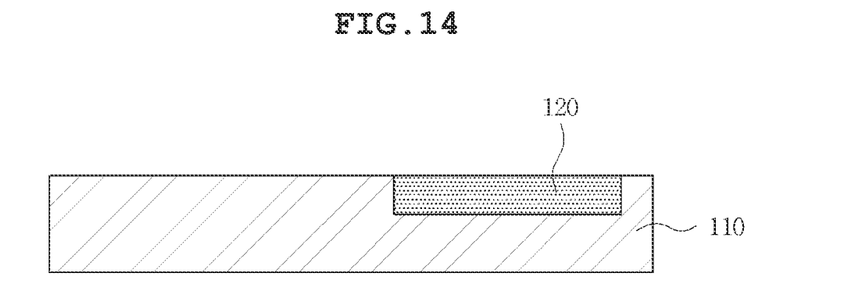
Figure 15:
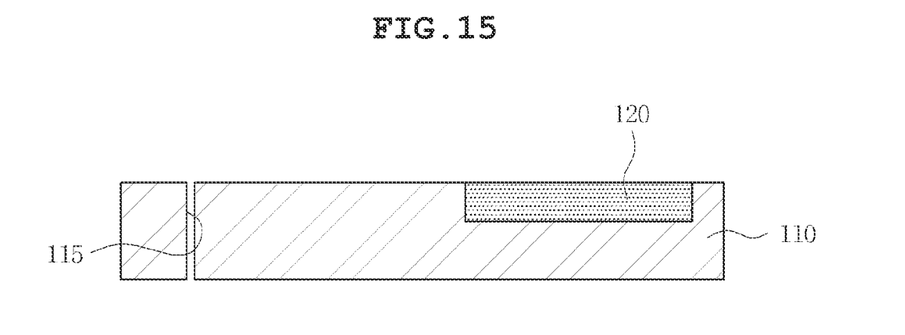
Figure 16:
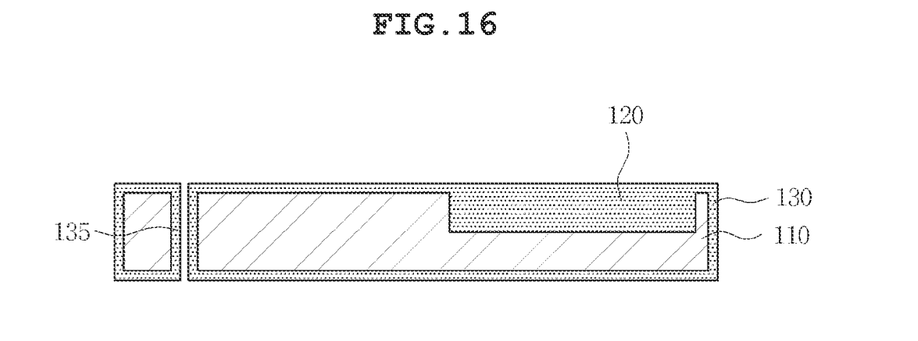

Further, as shown in FIGS. 14 to 16, the via may be progressively formed simultaneously with the process of forming the circuit layer.

As shown in FIG. 14, the metal core member 110 on which the oxide insulating core layer 120 is formed is first prepared. The metal core member 110 is formed by the above-mentioned methods with reference to FIGS. 5 to 7 and therefore, the detailed description thereof will be described.

Next, as shown in FIG. 15, a through hole 115 is formed on the metal core member 110 on which the oxide insulating core layer 120 is formed. A mechanical drill scheme using a drill bit and a laser processing scheme using YAG laser, $CO_2$ laser may be used.

Thereafter, as shown in FIG. 16, the insulating layer 135 is formed in an inner wall of the through hole 115. The insulating layer 135 serves to electrically separate the metal core member 110 and the via 145. The process is performed simultaneously with the surface anodizing process forming the oxide insulating layer 130 on the outer surface of the metal core member 110 and thus, the manufacturing process is reduced and productivity is improved.

Figure 17:
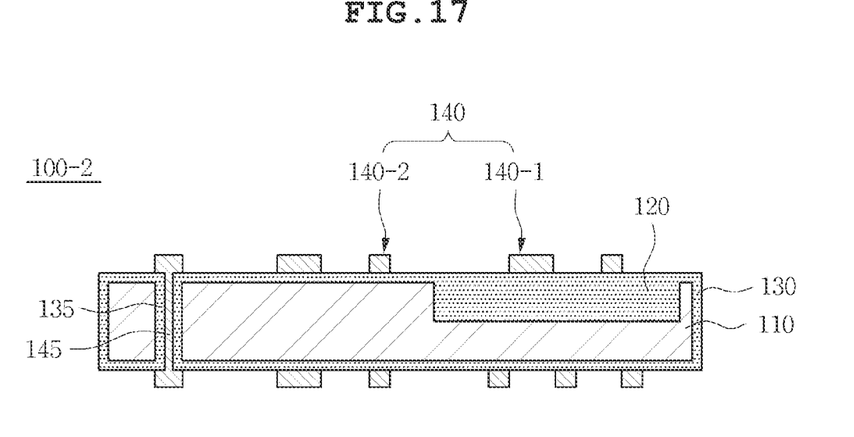

As shown in FIG. 17, the via 145 connecting the circuit layers 140 formed on both surfaces of the heat-radiating substrate is formed in the insulating layer 135. Generally, the via is formed through the plating process and the manufacturing process may be reduced by simultaneously forming the circuit layer 140 and the via.

For example, after the plating layer is formed, the via 145 and the circuit layer 140 may be simultaneously formed by a panel plating method performing a picture developing process and an etching process and the pattern plating method may be applied.

According to the present invention, the hybrid heat-radiating substrate adopts the metal core layer to easily discharge heat generated from the heat generating elements, thereby making it possible to keep the performance of the heat generating elements in the optimized state.

Further, according to the present invention, the hybrid heat-radiating substrate includes the oxide insulating core layer on which the thermally weakened elements are mounted to thermally separate the heat generating elements and the thermally weakened elements so that heat generated from the heat generating elements is not transferred to the thermally weakened elements mounted on the same substrate while keeping the heat-radiating property.

In addition, according to the present invention, the hybrid heat-radiating substrate has the shape where the metal core layer is integrated with the oxide insulating core layer such that it is sturdier than the case where two core layers are physically separated from each other or bonded to each other by an adhesive, and so on.

Moreover, according to the present invention, the method of manufacturing the hybrid heat-radiating substrate does not depend on a scheme that forms the heat generating elements and the thermally weakened elements on a separate substrate and bonds them to each other but depends on a scheme that directly forms the oxide insulating core layer on the metal core layer through volume anodizing, thereby reducing the manufacturing time and improving productivity.

Embodiments of the present invention may suitably comprise, consist or consist essentially of the elements disclosed and may be practiced in the absence of an element not disclosed. For example, it can be recognized by those skilled in the art that certain steps can be combined into a single step.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

The singular forms "a," "an," and "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

Ranges may be expressed herein as from about one particular value, and/or to about another particular value. When such a range is expressed, it is to be understood that another embodiment is from the one particular value and/or to the other particular value, along with all combinations within said range.

Although the present invention has been described in detail, it should be understood that various changes, substitutions, and alterations can be made hereupon without departing from the principle and scope of the invention. Accordingly, the scope of the present invention should be determined by the following claims and their appropriate legal equivalents.

What is claimed is:

1. A method of manufacturing a hybrid heat-radiating substrate, comprising:
    providing a metal core member;
    forming an oxide insulating core layer by performing volume anodizing on the metal core member in a thickness direction;
    forming an oxide insulating layer by performing surface anodizing on one surface or both surfaces of the metal core member; and
    forming a circuit layer that is configured to include first circuit patterns positioned on the oxide insulating core layer and second circuit patterns positioned on the oxide insulating layer,
    wherein the oxide insulating layer has a thickness thinner than the oxide insulating core layer.

2. The method of manufacturing a hybrid heat-radiating substrate of claim 1, further comprising:
    after the forming the circuit layer, forming a protective layer covering the circuit layer.

3. The method of manufacturing a hybrid heat-radiating substrate of claim 2, further comprising:
    after the forming the protective layer, mounting thermally weakened elements having higher vulnerability of heat than heat generating elements on the first circuit patterns formed on the oxide insulating core layer; and
    mounting the heat generating elements on the second circuit patterns formed on the oxide insulating layer.

4. The method of manufacturing a hybrid heat-radiating substrate of claim 1, further comprising:
    forming a via connecting the circuit layers formed on both surfaces of the metal core member.

5. The method of manufacturing a hybrid heat-radiating substrate of claim 4, wherein the forming the via is performed by forming a through hole penetrating through the metal core member after forming the oxide insulating core layer, forming an insulating layer in an inner wall of the through hole at the forming the oxide insulating layer, and forming the plating layer in an inner wall of the insulating layer at the forming the circuit layer.

* * * * *